United States Patent
Hisamura

(10) Patent No.: US 8,957,512 B2
(45) Date of Patent: Feb. 17, 2015

(54) OVERSIZED INTERPOSER

(75) Inventor: Toshiyuki Hisamura, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 308 days.

(21) Appl. No.: 13/527,453

(22) Filed: Jun. 19, 2012

(65) Prior Publication Data

US 2013/0333921 A1 Dec. 19, 2013

(51) Int. Cl.
*H01L 23/02* (2006.01)
*H01L 21/00* (2006.01)

(52) U.S. Cl.
USPC .... 257/686; 257/724; 257/778; 257/E23.179; 257/E21.511; 438/106; 438/108; 438/128

(58) Field of Classification Search
CPC ............... H01L 2224/97; H01L 2224/16145; H01L 24/97; H01L 2225/06555
USPC .................. 257/686, 724, 725, 778, E23.085, 257/E23.179, E21.511; 438/106, 108, 128
See application file for complete search history.

(56) References Cited

U.S. PATENT DOCUMENTS

| | | |
|---|---|---|
| 4,467,342 A | 8/1984 | Tower |
| 4,803,595 A | 2/1989 | Kraus et al. |
| 5,285,236 A | 2/1994 | Jain |
| 5,399,898 A | 3/1995 | Rostoker |
| 5,437,946 A | 8/1995 | McCoy |
| 5,489,804 A | 2/1996 | Pasch |
| 5,715,144 A | 2/1998 | Ameen et al. |
| 5,787,007 A | 7/1998 | Bauer |
| 5,814,847 A | 9/1998 | Shihadeh et al. |
| 5,869,894 A | 2/1999 | Degani et al. |
| 5,897,986 A | 4/1999 | Dunn et al. |
| 5,907,903 A | 6/1999 | Ameen et al. |
| 6,150,840 A | 11/2000 | Patel |
| 6,157,213 A | 12/2000 | Voogel |
| 6,160,418 A | 12/2000 | Burnham |
| 6,204,689 B1 | 3/2001 | Percey et al. |
| 6,215,327 B1 | 4/2001 | Lyle |
| 6,216,257 B1 | 4/2001 | Agrawal et al. |
| 6,218,864 B1 | 4/2001 | Young et al. |
| 6,239,366 B1 | 5/2001 | Hsuan et al. |
| 6,288,772 B1 | 9/2001 | Shinozaki et al. |
| 6,359,466 B1 | 3/2002 | Sharpe-Geisler |
| 6,369,444 B1 | 4/2002 | Degani et al. |
| 6,396,303 B1 | 5/2002 | Young |
| 6,407,456 B1 | 6/2002 | Ball |
| 6,410,983 B1 | 6/2002 | Moriizumi et al. |

(Continued)

FOREIGN PATENT DOCUMENTS

EP   2 151717 A1   2/2010

OTHER PUBLICATIONS

U.S. Appl. No. 13/369,215, filed Feb. 8, 2012, Banijamali, Bahareh, Xilinx, Inc., 2100 Logic Drive, San Jose, CA US.

(Continued)

*Primary Examiner* — Minh-Loan Tran
(74) *Attorney, Agent, or Firm* — W. Eric Webostad

(57) ABSTRACT

An embodiment of an interposer is disclosed. For this embodiment of the interposer, a first circuit portion is created responsive to a first printing region. A second circuit portion is created responsive to a second printing region. The interposer has at least one of: (a) a length dimension greater than a maximum reticle length dimension, and (b) a width dimension greater than a maximum reticle width dimension.

14 Claims, 12 Drawing Sheets

(56) References Cited

U.S. PATENT DOCUMENTS

| | | |
|---|---|---|
| 6,429,509 B1 | 8/2002 | Hsuan |
| 6,448,808 B2 | 9/2002 | Young et al. |
| 6,500,696 B2 | 12/2002 | Sutherland |
| 6,512,573 B2 | 1/2003 | Fürter |
| 6,525,407 B1 | 2/2003 | Drewery |
| 6,559,531 B1 | 5/2003 | Sutherland |
| 6,583,854 B1 | 6/2003 | Hazama et al. |
| 6,611,635 B1 | 8/2003 | Yoshimura et al. |
| 6,731,009 B1 | 5/2004 | Jones et al. |
| 6,734,553 B2 | 5/2004 | Kimura |
| 6,870,271 B2 | 3/2005 | Sutherland et al. |
| 6,930,378 B1 | 8/2005 | St. Amand et al. |
| 6,944,809 B2 | 9/2005 | Lai et al. |
| 6,972,487 B2 | 12/2005 | Kato et al. |
| 6,984,889 B2 | 1/2006 | Kimura |
| 6,992,395 B2 | 1/2006 | Fukasawa |
| 7,002,828 B2 | 2/2006 | Santin et al. |
| 7,028,281 B1 | 4/2006 | Agrawal et al. |
| 7,030,466 B1 | 4/2006 | Hsuan |
| 7,071,568 B1 | 7/2006 | St. Amand et al. |
| 7,087,989 B2 | 8/2006 | Nakayama |
| 7,088,134 B1 | 8/2006 | Agrawal et al. |
| 7,095,253 B1 | 8/2006 | Young |
| 7,098,542 B1 | 8/2006 | Hoang et al. |
| 7,107,565 B1 | 9/2006 | Lindholm et al. |
| 7,132,753 B1 | 11/2006 | St. Amand et al. |
| 7,181,718 B1 | 2/2007 | Bilski et al. |
| 7,187,200 B2 | 3/2007 | Young |
| 7,190,190 B1 | 3/2007 | Camarota et al. |
| 7,193,433 B1 | 3/2007 | Young |
| 7,196,543 B1 | 3/2007 | Young et al. |
| 7,199,610 B1 | 4/2007 | Young et al. |
| 7,202,697 B1 | 4/2007 | Kondapalli et al. |
| 7,202,698 B1 | 4/2007 | Bauer et al. |
| 7,205,790 B1 | 4/2007 | Young |
| 7,215,016 B2 | 5/2007 | Wang |
| 7,215,138 B1 | 5/2007 | Kondapalli et al. |
| 7,218,139 B1 | 5/2007 | Young et al. |
| 7,218,140 B1 | 5/2007 | Young |
| 7,218,143 B1 | 5/2007 | Young |
| 7,221,186 B1 | 5/2007 | Young |
| 7,230,329 B2 | 6/2007 | Sawamoto et al. |
| 7,233,168 B1 | 6/2007 | Simkins |
| 7,253,658 B1 | 8/2007 | Young |
| 7,256,612 B1 | 8/2007 | Young et al. |
| 7,265,576 B1 | 9/2007 | Kondapalli et al. |
| 7,268,587 B1 | 9/2007 | Pham et al. |
| 7,274,214 B1 | 9/2007 | Young |
| 7,276,934 B1 | 10/2007 | Young |
| 7,279,929 B1 | 10/2007 | Young |
| 7,284,226 B1 | 10/2007 | Kondapalli |
| 7,301,824 B1 | 11/2007 | New |
| 7,314,174 B1 | 1/2008 | Vadi et al. |
| 7,337,422 B1 | 2/2008 | Becker et al. |
| 7,345,507 B1 | 3/2008 | Young et al. |
| 7,402,443 B1 | 7/2008 | Pang et al. |
| 7,402,901 B2 | 7/2008 | Hatano et al. |
| 7,425,760 B1 | 9/2008 | Guenin et al. |
| 7,436,061 B2 | 10/2008 | Nakayama |
| 7,451,421 B1 | 11/2008 | Bauer et al. |
| 7,459,776 B1 | 12/2008 | St. Amand et al. |
| 7,491,576 B1 | 2/2009 | Young et al. |
| 7,498,192 B1 | 3/2009 | Goetting et al. |
| 7,859,119 B1 | 12/2010 | St. Amand et al. |
| 7,906,852 B2 | 3/2011 | Nishimura et al. |
| 7,999,383 B2 | 8/2011 | Hollis |
| 8,001,511 B1 | 8/2011 | Bauer et al. |
| 8,062,968 B1 | 11/2011 | Conn |
| 8,072,057 B2 | 12/2011 | Matsumura |
| 8,080,874 B1 | 12/2011 | Werner et al. |
| 8,097,957 B2 | 1/2012 | Chen et al. |
| 8,163,600 B2 | 4/2012 | Chow et al. |
| 8,227,904 B2 | 7/2012 | Braunisch et al. |
| 8,237,289 B2 | 8/2012 | Urakawa |
| 8,274,794 B2 | 9/2012 | Huang et al. |
| 8,295,056 B2 | 10/2012 | Andry et al. |
| 8,338,963 B2 | 12/2012 | Haba et al. |
| 8,344,519 B2 | 1/2013 | Lu et al. |
| 8,415,783 B1 | 4/2013 | Rahman et al. |
| 2002/0024146 A1 | 2/2002 | Furusawa |
| 2002/0175421 A1 | 11/2002 | Kimura |
| 2003/0183917 A1 | 10/2003 | Tsai et al. |
| 2004/0184250 A1 | 9/2004 | Wang |
| 2004/0195668 A1 | 10/2004 | Sawamoto |
| 2004/0195682 A1 | 10/2004 | Kimura |
| 2004/0227223 A1 | 11/2004 | Sawamoto |
| 2005/0112614 A1 | 5/2005 | Cook et al. |
| 2006/0001163 A1 | 1/2006 | Kolbehdari et al. |
| 2006/0017147 A1 | 1/2006 | Drost et al. |
| 2006/0099736 A1 | 5/2006 | Nagar et al. |
| 2006/0157866 A1 | 7/2006 | Le et al. |
| 2006/0220227 A1 | 10/2006 | Marro |
| 2006/0226527 A1 | 10/2006 | Hatano et al. |
| 2006/0226529 A1 | 10/2006 | Kato et al. |
| 2007/0023921 A1 | 2/2007 | Zingher et al. |
| 2007/0029646 A1 | 2/2007 | Voldman |
| 2007/0204252 A1 | 8/2007 | Furnish et al. |
| 2007/0210428 A1 | 9/2007 | Tan et al. |
| 2007/0231966 A1 | 10/2007 | Egawa |
| 2007/0278642 A1 | 12/2007 | Yamaguchi et al. |
| 2008/0179735 A1 | 7/2008 | Urakawa |
| 2009/0057919 A1 | 3/2009 | Lin et al. |
| 2009/0267238 A1 | 10/2009 | Joseph et al. |
| 2010/0330741 A1 | 12/2010 | Huang et al. |
| 2011/0019368 A1 | 1/2011 | Andry et al. |
| 2011/0169171 A1 | 7/2011 | Marcoux |
| 2011/0180317 A1 | 7/2011 | Takahashi et al. |
| 2011/0254162 A1 | 10/2011 | Hollis |
| 2011/0316572 A1 | 12/2011 | Rahman |
| 2012/0019292 A1 | 1/2012 | Lu et al. |
| 2012/0020027 A1 | 1/2012 | Dungan et al. |
| 2012/0032342 A1 | 2/2012 | Min et al. |
| 2012/0124257 A1 | 5/2012 | Wu |
| 2012/0206889 A1 | 8/2012 | Norman |
| 2012/0301977 A1 | 11/2012 | Andry et al. |
| 2012/0319248 A1 | 12/2012 | Rahman |
| 2013/0020675 A1 | 1/2013 | Kireev et al. |
| 2013/0134553 A1 | 5/2013 | Kuo et al. |
| 2014/0049932 A1 | 2/2014 | Camarota |
| 2014/0070423 A1* | 3/2014 | Woychik et al. ............ 257/774 |
| 2014/0077391 A1* | 3/2014 | Kikuchi et al. ............ 257/774 |
| 2014/0084459 A1* | 3/2014 | Yu et al. ............ 257/737 |

OTHER PUBLICATIONS

U.S. Appl. No. 13/399,939, filed Feb. 17, 2012, Wu, Ephrem C., Xilinx, Inc., 2100 Logic Drive, San Jose, CA US.

U.S. Appl. No. 13/535,102, filed Jun. 27, 2012, Camarota, Rafael C., Xilinx, Inc., 2100 Logic Drive, San Jose, CA US.

U.S. Appl. No. 13/935,066, filed Jul. 3, 2013, Camarota, Xilinx, Inc., San Jose, CA USA.

U.S. Appl. No. 14/321,591, filed Jul. 1, 2014, Hisamura, Xilinx, Inc., San Jose, CA USA.

Chi, Chun-Chuan et al., "Post-Bond Testing of 2.5D-SICs and 3D-SICs Containing a Passive Silicon Interposer Base," *Proc. of the 2011 IEEE International Test Conference*, Sep. 20, 2011, pp. 1-10, IEEE, Piscataway, New Jersey, USA.

* cited by examiner

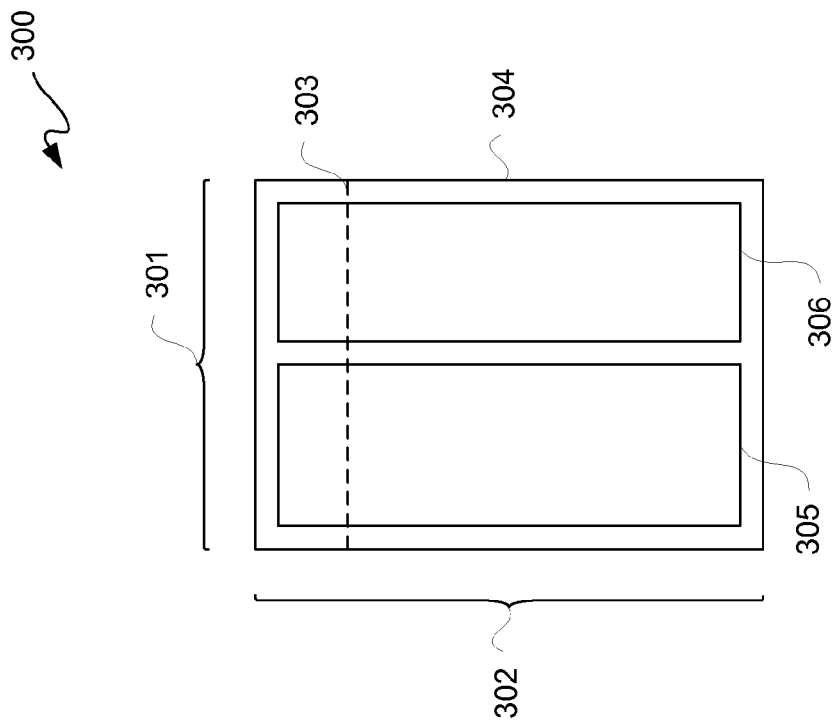
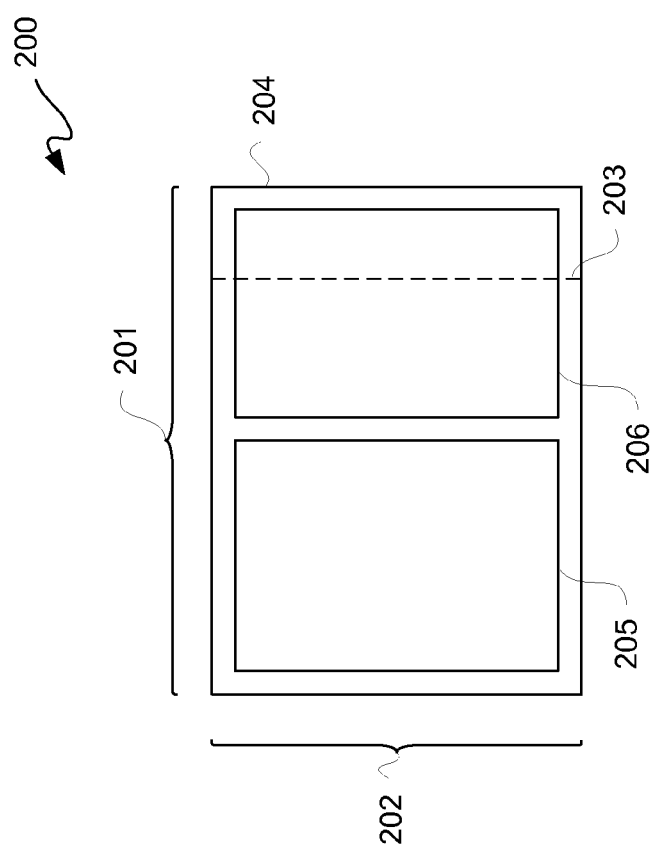
FIG. 3
FIG. 2

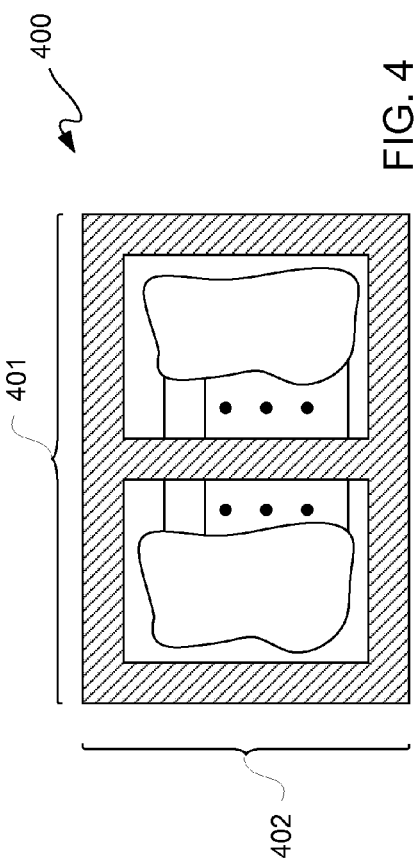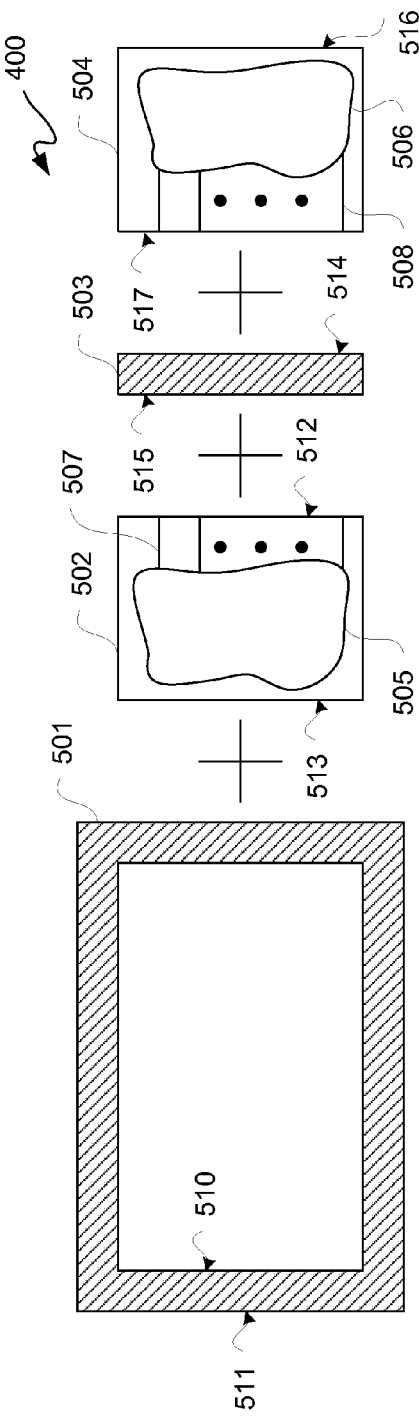

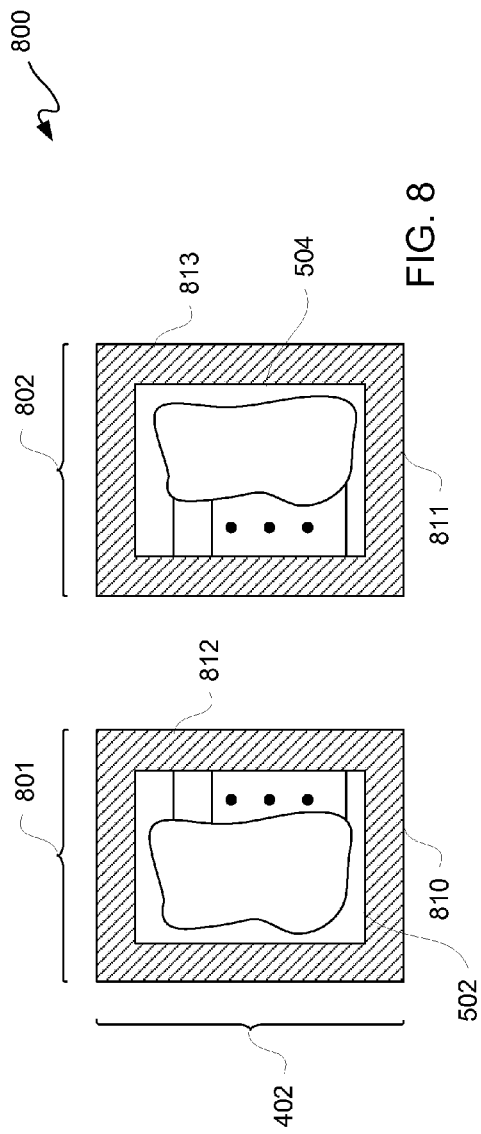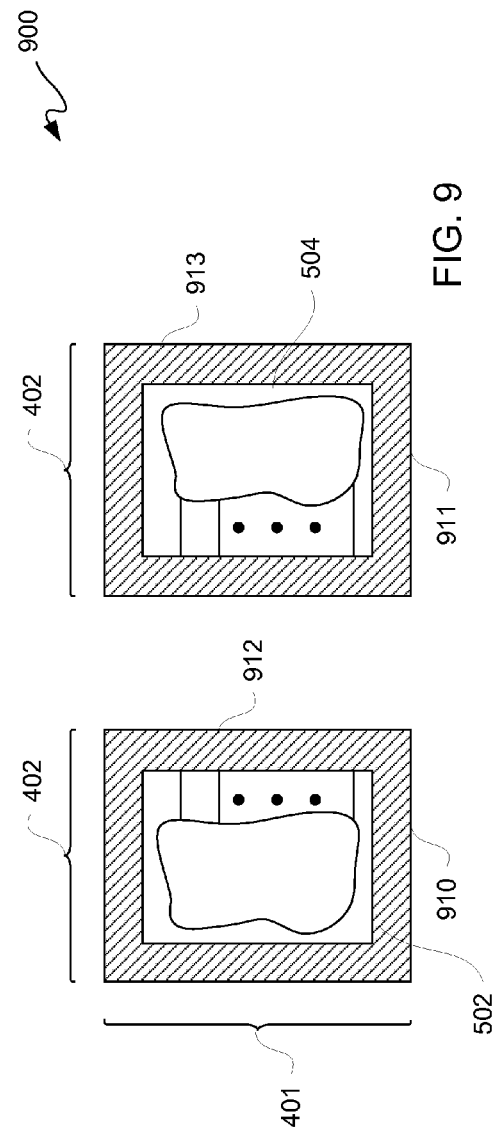

OVERSIZED INTERPOSER

FIELD OF THE INVENTION

An embodiment relates to integrated circuit devices ("ICs"). More particularly, an embodiment relates to an oversized interposer for an IC.

BACKGROUND

Integrated circuits have become more "dense" over time, i.e., more logic features have been implemented in an IC. More recently, Stacked-Silicon Interconnect Technology ("SSIT") allows for more than one semiconductor die to be placed in a single package. SSIT ICs may be used to address increased demand for having various ICs within a single package. However, even though ICs using SSIT have more than one die, such ICs still have significant restriction due to interposer size. Conventionally, an interposer has been limited due to maximum field size of a reticle of a lithographic scanner. Hence, it is desirable to provide a larger interposer that is not so restricted to a maximum scanner field size restriction.

SUMMARY

One or more embodiments generally relate to an oversized interposer for an IC.

An embodiment relates generally to an interposer. In such an embodiment, a first circuit portion is created responsive to a first printing region; and a second circuit portion created responsive to a second printing region. The interposer has at least one of a length dimension or a width dimension greater than a maximum reticle length dimension or a maximum reticle width dimension, respectively.

In various other embodiments of the embodiment described in the preceding paragraph, such interposer may further include one or more of the following. First conductive lines of the first circuit portion can be interconnected with second conductive lines of the second circuit portion with bulging at intersections thereof responsive to the first printing region and the second printing region printed overlapping one another. First conductive lines of the first circuit portion can be interconnected with second conductive lines of the second circuit portion with bulging at intersections thereof responsive to the first printing region and the second printing region printed abutting one another. First conductive lines of the first circuit portion can be interconnected with second conductive lines of the second circuit portion with pinching at intersections thereof responsive to the first printing region and the second printing region printed spaced apart from one another. The first printing region and the second printing region can be of a same mask. The mask can include: a first light blocking region disposed between the first printing region and the second printing region; and a second light blocking region disposed around the first printing region, the second printing region, and the first light blocking region. The first circuit portion and the second circuit portion can have no die seal between the first circuit portion and the second circuit portion. The first printing region and the second printing region can be for a first slice and a second slice, respectively, of the interposer. The first printing region and the second printing region can be for imaging with at least one sufficiently large dimension so as to avoid optical proximity correction for printing the first circuit portion proximate to the second circuit portion. The interposer can have the length dimension greater than 33 mm or the width dimension greater than 26 mm. The first printing region and the second printing region can be of a same mask set including a first mask and a second mask, respectively for the first printing region and the second printing region.

An embodiment relates generally to a method for fabricating an interposer. In such an embodiment, a first circuit portion of the interposer is printed responsive to a first printing region, and a second circuit portion of the interposer is printed responsive to a second printing region. The second circuit portion is printed proximate to the first circuit portion for interconnection therewith. The interposer has at least one of a length dimension or a width dimension greater than a maximum reticle length dimension or a maximum reticle width dimension, respectively.

In various other embodiments of the embodiment described in the preceding paragraph, such interposer may further include one or more of the following. First conductive lines of the first circuit portion can be interconnected with second conductive lines of the second circuit portion with bulging at intersections thereof responsive to the first printing region and the second printing region printed overlapping one another. First conductive lines of the first circuit portion can be interconnected with second conductive lines of the second circuit portion with bulging at intersections thereof responsive to the first printing region and the second printing region printed abutting one another. First conductive lines of the first circuit portion can be interconnected with second conductive lines of the second circuit portion with pinching at intersections thereof responsive to the first printing region and the second printing region printed spaced apart from one another. The first circuit portion and the second circuit portion can have no die seal between the first circuit portion and the second circuit portion. Furthermore, a mask set having a first mask and a second mask can be obtained. The first printing region can be of the first mask, and the second printing region can be of the second mask. The printing of the first circuit portion responsive to the first printing region can include printing each of a plurality of first circuit portions in at least one row with spaces between the first circuit portions. The first mask can be replaced with the second mask, and the printing of the second circuit portion responsive to the second printing region can include printing each of a plurality of second circuit portions in the at least one row with the second printing region printed in the spaces. The interposer can have the length dimension greater than 33 mm or the width dimension greater than 26 mm.

An embodiment relates generally to a mask set. In such an embodiment, a first mask and a second mask are included. The first mask has a first printing region, and the second mask has a second printing region. The first printing region is to print a first circuit portion of an interposer. The second printing region is to print a second circuit portion of the interposer proximate to the first circuit portion for interconnection between the first circuit portion and the second circuit portion. The interposer has at least one of a length dimension or a width dimension greater than a maximum reticle length dimension or a maximum reticle width dimension, respectively.

In various other embodiments of the embodiment described in the preceding paragraph, such mask set may further include one or more of the following. The first printing region can be laid out to repetitively print the first circuit portion to provide a row of first circuit portions on a wafer with spaces between the first circuit portions. The second printing region can be laid out to repetitively print the second circuit portion to provide the row with second circuit portions iteratively in the spaces between the first circuit portions. The first printing and the second printing region can be laid out so as not to include a die seal between the first circuit portion and the second circuit portion. The first printing region and the second printing region can be to image with at least one sufficiently large dimension so as to avoid optical proximity correction to print the first circuit portion proximate to the second circuit portion. The interposer can have the length dimension greater than 33 mm or the width dimension greater than 26 mm.

BRIEF DESCRIPTION OF THE DRAWINGS

Accompanying drawings show exemplary embodiments. However, the accompanying drawings should not be taken to limit the embodiments shown, but are for explanation and understanding only.

FIG. 2 is a block diagram depicting an exemplary embodiment of a stacked die assembly.

FIG. 3 is a block diagram depicting another exemplary embodiment of a stacked die assembly.

FIG. 4 is a block diagram depicting an exemplary embodiment of dual printing region mask.

FIG. 5 is an exploded view of the exemplary embodiment of FIG. 4.

FIG. 8 is a block diagram depicting an exemplary embodiment of a mask set.

FIG. 9 is a block diagram depicting another exemplary embodiment of a mask set.

FIG. 11-1 is a block diagram depicting an exemplary embodiment of a portion of a substrate having images printed thereon using a first mask of the mask set of FIG. 8.

FIG. 11-2 is the block diagram of the exemplary embodiment of FIG. 11-1 having images printed thereon using a second mask of the mask set of FIG. 8.

FIG. 12-1 is a block diagram depicting an exemplary embodiment of a portion of an interposer having conductive lines formed using multistep imaging with overlapping fields.

FIG. 12-2 is a block diagram depicting an exemplary embodiment of a portion of an interposer having conductive lines formed using multistep imaging with abutting fields.

FIG. 12-3 is a block diagram depicting an exemplary embodiment of a portion of an interposer having conductive lines formed using multistep imaging with spaced-apart fields.

DETAILED DESCRIPTION

Figure 1:
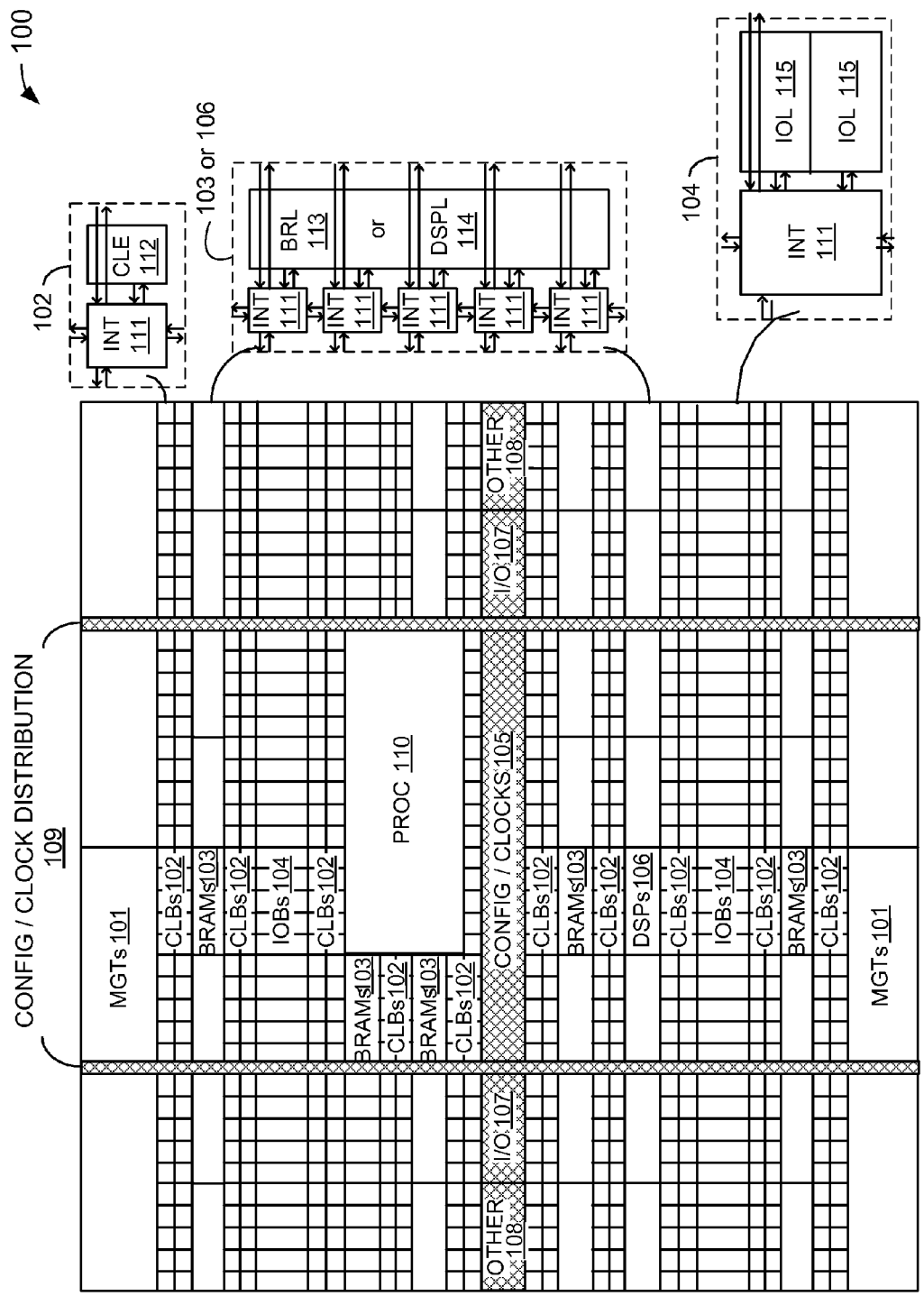
FIG. 1 is a simplified block diagram depicting an exemplary embodiment of a columnar Field Programmable Gate Array ("FPGA") architecture.

In the following description, numerous specific details are set forth to provide a more thorough description of the specific embodiments. It should be apparent, however, to one skilled in the art, that one or more embodiments may be practiced without all the specific details given below. In other instances, well known features have not been described in detail so as not to obscure the one or more embodiments. For ease of illustration, the same number labels are used in different diagrams to refer to the same items; however, in alternative embodiments the items may be different.

Before describing exemplary embodiments illustratively depicted in the several figures, a general introduction is provided to further understanding.

A lithographic scanner has a reticle field size limitation. The limited size of the reticle field heretofore limited the size of an interposer that could be created. For example, a conventional scanner field size limit is 26 mm by 33 mm. However, larger interposers are needed in order to accommodate more and/or larger integrated circuit dies in order to improve performance and/or increase pin-count density.

With the above general understanding borne in mind, various embodiments for a larger interposer, as well as methodology for creating same, are generally described below. A larger interposer may be created using multistep imaging by effectively dividing the interposer into image slices ("slices") and lithographically stitching the slices together. Such multistep imaging may use a multi-image mask or a mask set with multiple masks for creating an oversized interposer, namely an interposer having at least one dimension greater than a maximum reticle field size limit. By lithographic imaging with relatively large feature sizes for lithographically stitching or interconnecting circuit slices of an interposer, multiple slices may be imaged to create an interposer larger than at least one maximum dimension afforded by reticle field size of a lithographic scanner.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these PLDs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figures 1, 11:
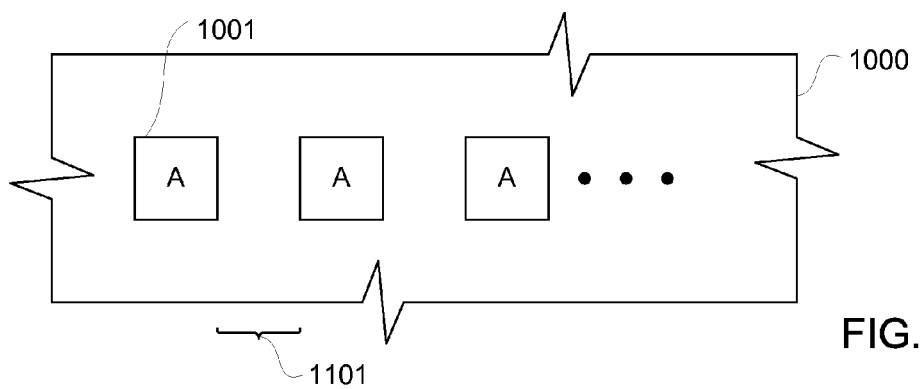
Figures 2, 11:
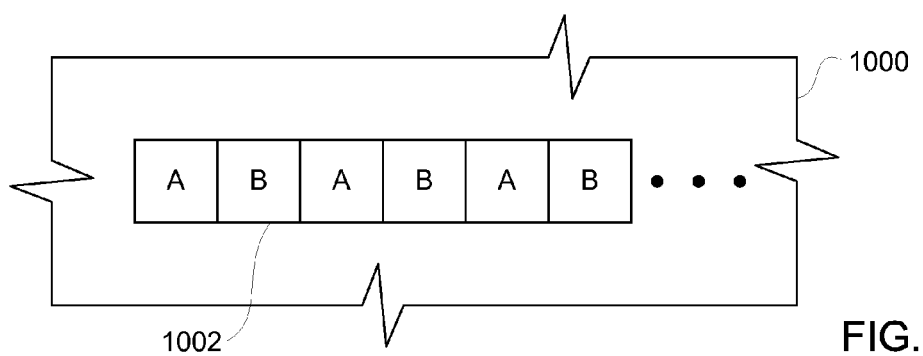

FIG. 2 is a block diagram depicting an exemplary embodiment of a stacked die assembly 200. Stacked die assembly 200 includes semiconductor integrated circuit dies 205 and 206 mounted on to interposer 204. Interposer 204 may be made using a semiconductor substrate or a dielectric substrate. For purposes of clarity by way of example not limitation, it shall be assumed that interposer 204 is made using a silicon substrate from a silicon wafer. Circuit dies 205 and 206 may be an FPGA die and a memory die, an FPGA die and another FPGA die, or any combination of IC dies.

Interposer 204 has a length 201 and a width 202. Conventionally, length and width of an interposer were limited by reticle size of a lithographic scanner. For example, heretofore the largest interposer that could be conventionally made was 26 mm by 33 mm. Thus, for example, conventionally a maximum length of interposer 204 may have been substantially shorter than length 201, as generally indicated by dashed line 203. However, by using dual image printing, as described below in additional detail, length 201 may exceed a maximum dimension associated with a conventional length limit of a reticle field size of a lithographic scanner.

Figures 1, 12:
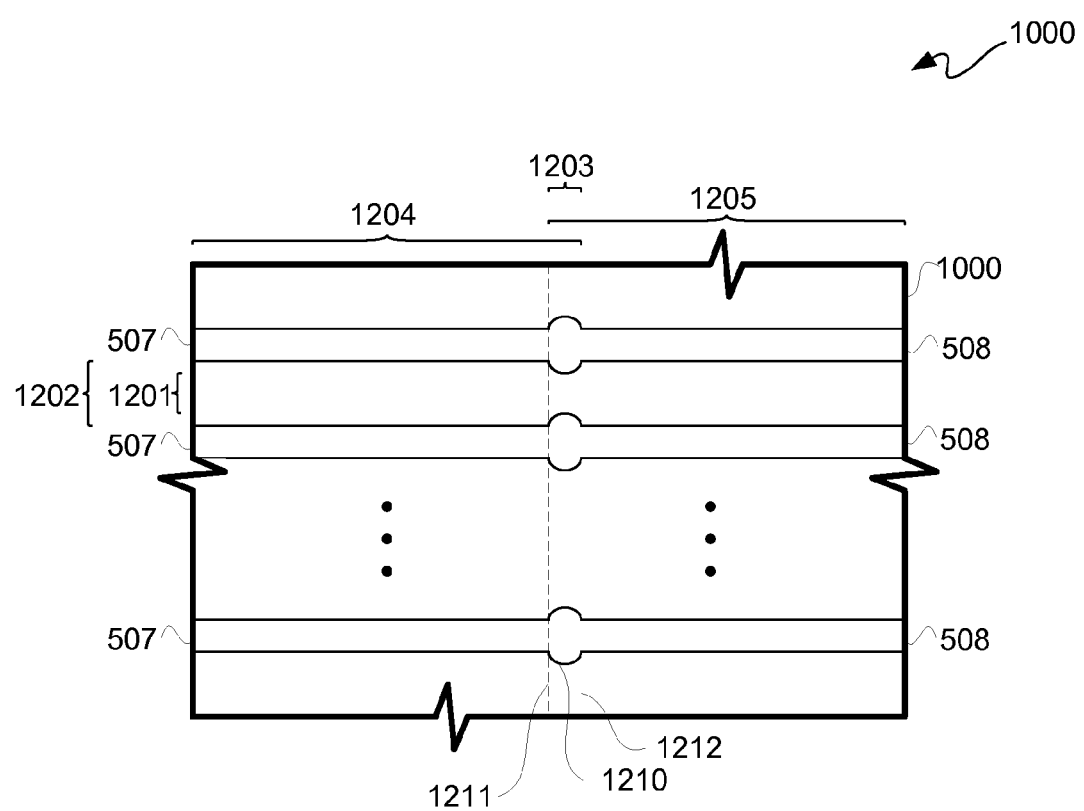
Figures 2, 12:
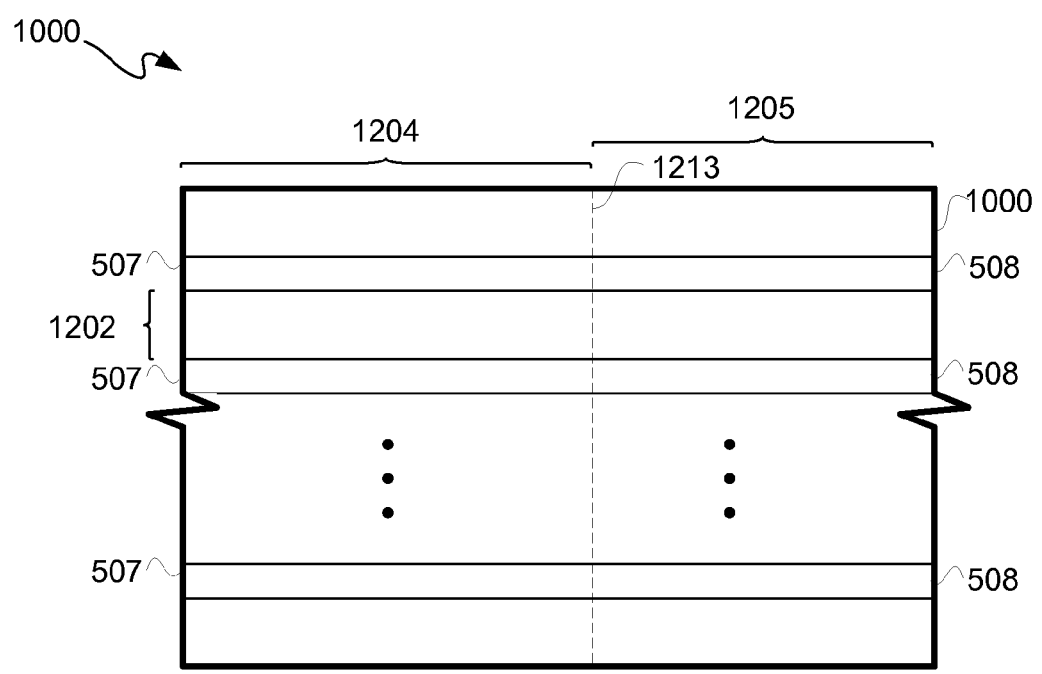
Figures 3, 12:
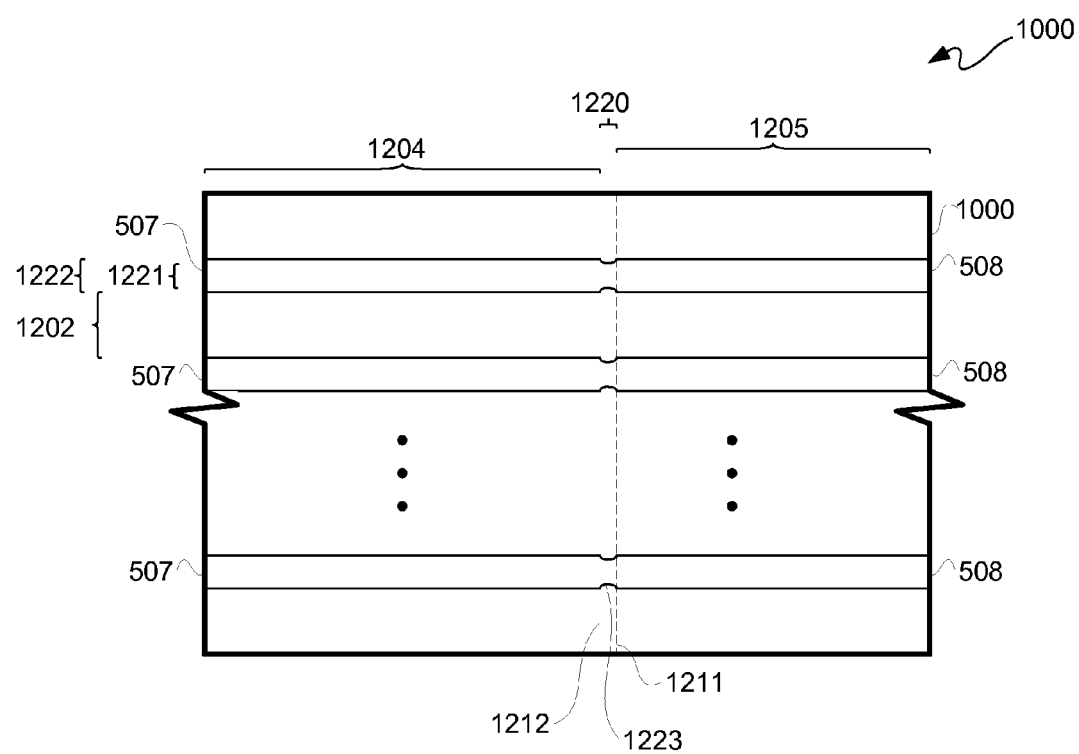

FIG. 3 is a block diagram depicting another exemplary embodiment of a stacked die assembly 300. Stacked die assembly 300 includes semiconductor integrated circuit dies 305 and 306 mounted on to interposer 304. Interposer 304 may be made using a semiconductor substrate or a dielectric substrate. For purposes of clarity by way of example not limitation, it shall be assumed that interposer 304 is made using a silicon substrate from a silicon wafer. Circuit dies 305 and 306 may be an FPGA die and a memory die, an FPGA die and another FPGA die, or any combination of IC dies.

Interposer 304 has a length 301 and a width 302. Conventionally, length and width of an interposer were limited by reticle size of a lithographic scanner. Thus, for example, conventionally a maximum width of interposer 304 may have been substantially shorter than width 302, as generally indicated by dashed line 303. However, by using dual image printing, as described below in additional detail, width 302 may exceed a maximum dimension associated with a conventional width limit of a reticle field size of a lithographic scanner.

Accordingly, it should be appreciated that either or both length and width may exceed maximum dimensions associated therewith by using multistep image printing, as described below in additional detail. Along those lines, it should be understood that an interposer, such as interposer 204 or 304, may have one or more uppermost metal layers and/or via layers created using lithographic imaging which uses substantially larger resolution than state-of-the-art of lithographic imaging. Using such larger resolution, circuits associated with one image printing may be interconnected to circuits associated with another image printing for a same interposer with sufficient registration. This facilitates using multiple images to print slices of an interposer in order to exceed one or more dimensions associated with field limitations of a reticle of a lithographic scanner. Presently, this means forming an interposer having at least one dimension larger than a conventionally 26 mm by 33 mm interposer.

By imaging with a sufficiently large dimension or feature size, Optical Proximity Correction ("OPC") may be avoided for printing a first slice, such as a first circuit portion, proximate to a second slice, such as a second circuit portion, of an interposer for lithographic stitching of slices. For purposes of clarity by way of example not limitation, the following description is in terms of multistep image printing to exceed a maximum length associated with a field size of a reticle of a lithographic scanner. However, it should be understood that in other embodiments either or both length or width may exceed maximum dimensions associated with a field size of a reticle of a lithographic scanner.

While OPC may be avoided in an embodiment, in another embodiment, OPC may be used for lithographic stitching of slices. For example, a stitched area, namely where one slice image is printed overlaid on a previously printed image of another slice, overlay control and compensation may be provided using OPC. For purposes of clarity by way of example and not limitation, one or more layers of an interposer may be lithographically at a 65 nm technology level of maturity, where such one or more layers have comparably larger geometries than 0.3 microns. Along those lines, a deep-UV ("DUV") lithographic scanner or other lithographic scanner having a 256 nm or smaller wavelength source would be able to satisfactorily accurately position one slice proximate to another slice for lithographic stitching such two slices together.

FIG. 4 is a block diagram depicting an exemplary embodiment of dual printing region mask 400. Dual printing region mask 400 may have a length 401 and a width 402 corresponding to conventional maximum dimensions allowed by a lithographic scanner, which maximum dimensions may be associated with maximum dimensions of a field size of a reticle of a lithographic scanner. However, in other embodiments, one or more of length 401 and/or width 402 may be less than conventional maximum dimensions allowed for a lithographic scanner.

FIG. 5 is an exploded view of the exemplary embodiment of the dual printing region mask 400 of FIG. 4. Dual printing region mask 400 includes a first light blocking region 503, a second light blocking region 501, a first printing region 502, and a second printing region 504. First light blocking region 503 is disposed between first printing region 502 and second printing region 504. More particularly, a leftmost edge 515 of first light blocking region 503 borders a rightmost edge 512 of first printing region 502, and a rightmost edge 514 of first light blocking region 503 borders a leftmost edge 517 of second printing region 504.

Second light blocking region 501 may have an outer perimeter 511 and an inner perimeter 510. First printing region 502, first light blocking region 503, and second printing region 504 may all be located within inner perimeter 510, where a leftmost edge 513 of first printing region 502 borders a left side of inner perimeter 510 and a rightmost edge 516 of second printing region 504 borders a right side of inner perimeter 510.

First printing region 502 includes an image for lithographic imaging ("printing") of a first circuit portion, which in this exemplary embodiment includes a circuit module 505 and conductive lines 507 coupled thereto. Second printing region 504 includes an image for lithographic imaging of a second circuit portion, which in this exemplary embodiment includes a circuit module 506 and conductive lines 508 coupled thereto.

Conductive lines 507 and 508 may be used to interconnect first circuit portion and second circuit portion. Along those lines, first printing region 502 may be for a first slice of an interposer, and second printing region 504 may be for a second slice of an interposer, where such first slice and second slice may be interconnected to one another. Thus, first printing region 502 and second printing region 504 may each be laid out so as to repetitively print those regions for interconnecting pairs of such regions, as described below in additional detail. Such a first circuit portion may be laid out so as not to include a die seal associated with rightmost edge 512 of first printing region 502, and such second circuit portion may be laid out so as not to include a die seal associated with leftmost edge 517 of second printing region 504. However, for this exemplary embodiment, die seals may be located around the remainder of the perimeters of first printing region 502 and second printing region 504. Furthermore, along those lines, for this exemplary embodiment, no scribe lines are associated with edges 512 and 517; however, the remainder of the perimeters of first printing region 502 and second printing region 504 may include scribe lines. However, it should be understood that even though only two printing regions are illustratively depicted, in other embodiments more than two printing regions may be used. Furthermore, in other embodiments more than two circuit portions may be used for providing an interposer. In other words, even though an interposer is shown as being created using two slices, in other embodiments, more than two slices may be used.

Figure 6:
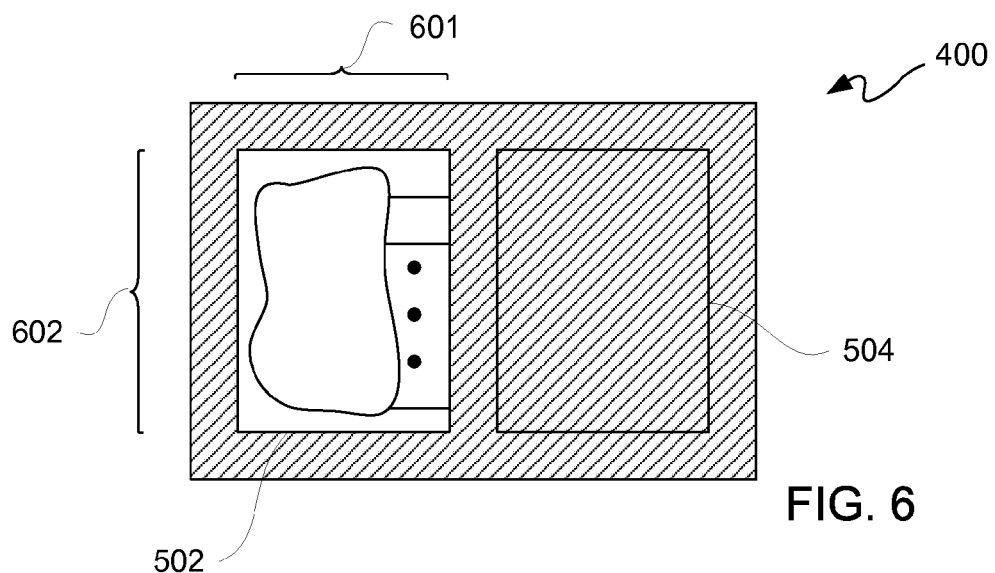
FIG. 6 is the block diagram of the exemplary embodiment of FIG. 4 with a second printing region shuttered off.

FIG. 6 is the block diagram of the exemplary embodiment of the dual printing region mask 400 of FIG. 4 with second printing region 504 shuttered off. In other words, dual printing region mask 400 may be loaded in a lithographic scanner, and such lithographic scanner may be set to shutter off a portion of dual printing region mask 400. In this exemplary embodiment, dual printing region mask 400 is illustratively depicted as having second printing region 504 shuttered off. Along those lines, length 601 and width 602 of first printing region 502 define an area of lithographic imaging onto a resist, such as photoresist for example, or other lithographically operative layer. Thus, a first circuit portion associated with first printing region 502 may be imaged onto such a resist.

Figure 7:
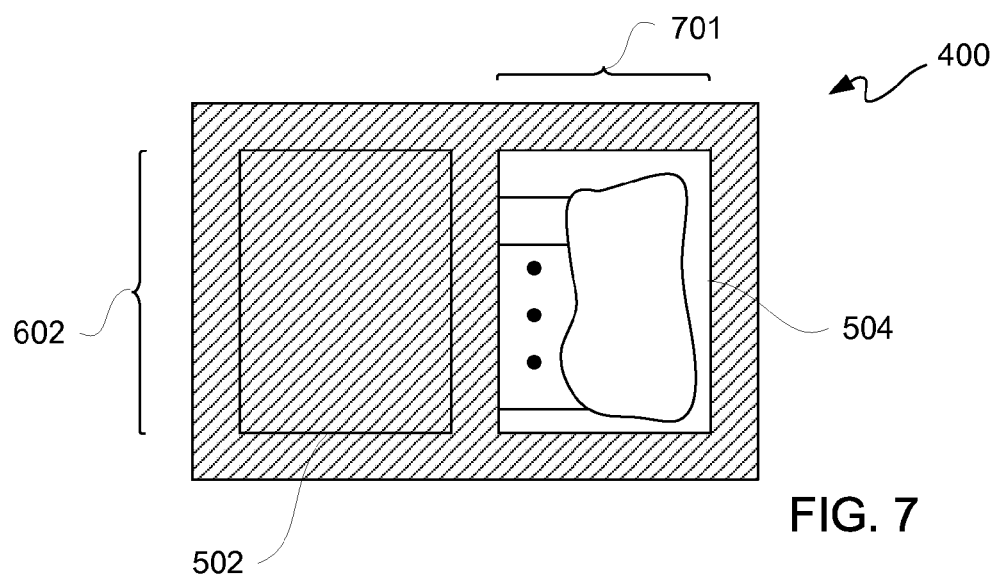
FIG. 7 is the block diagram of the exemplary embodiment of FIG. 4 with a first printing region shuttered off.

FIG. 7 is the block diagram of the exemplary embodiment of the dual printing region mask 400 of FIG. 4 with first printing region 502 shuttered off. In other words, dual printing region mask 400 may remain loaded in such a lithographic scanner, and such lithographic scanner may be reset to shutter off another portion of dual printing region mask 400. In this exemplary embodiment, dual printing region mask 400 is illustratively depicted as having first printing region 502 shuttered off. This allows for less handling of dual printing region mask 400, as dual printing region mask 400 does not have to be removed and reloaded into a lithographic scanner for alternately imaging using first printing region 502 and second printing region 504. Along those lines, length 701 and width 602 of second printing region 504 define an area of lithographic imaging onto such a resist, such as photoresist for example, or other lithographically operative layer as was used for imaging with such first printing region 502 of FIG. 6.

In this exemplary embodiment, widths of first printing region 502 and second printing region 504 are the same; however, in other embodiments such widths may be different. Generally, lithography placement accuracy may be better when the width of printing region 502 and second printing region 504 are the same, which means a scanner's stepping distance is the same. Furthermore, in this exemplary embodiment, lengths of first printing region 502 and second printing region 504 are the same; however, in other embodiments such lengths may be different.

FIG. 8 is a block diagram depicting an exemplary embodiment of a mask set 800. Mask set 800 includes a mask 810 and a mask 811. Mask 810 includes first printing region 502 located within the inner perimeter of a light blocking region 812, and mask 811 includes second printing region 504 within the inner perimeter of a light blocking region 813. In this exemplary embodiment, masks 810 and 811, as well as dual printing region mask 400, all have a same width 402. However, masks 810 and 811 may have lengths 801 and 802, respectively, which are shorter than length 401 of dual printing region mask 400.

FIG. 9 is a block diagram depicting another exemplary embodiment of a mask set 900. Mask set 900 includes a mask 910 and a mask 911. Mask 910 includes first printing region 502 located within the inner perimeter of a light blocking region 912, and mask 911 includes second printing region 504 within the inner perimeter of the light blocking region 913. In this exemplary embodiment, masks 810 and 811 are effectively rotated 90° with respect to dual printing region mask 400. Thus, masks 810 and 811 may each have a width 401 which is longer than width 402 of dual printing region mask 400. Furthermore, masks 810 and 811 may each have a length 402. Along those lines, the overall areas of first printing region 502 and second printing region 504 respectively of masks 810 and 811 may be approximately twice that of those printing regions of dual printing region mask 400. By having larger first and second printing regions, mask set 900 may be used to image more refined features and/or print to larger areas for forming and interposer.

Figure 10:
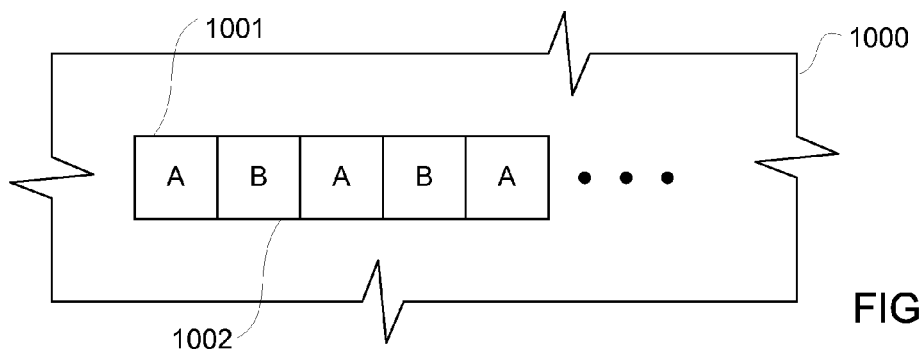
FIG. 10 is a block diagram depicting an exemplary embodiment of a portion of a substrate having images printed thereon using the dual printing region mask of FIG. 4.

FIG. 10 is a block diagram depicting an exemplary embodiment of a portion of a substrate 1000 having images A and B printed thereon using the dual printing region mask 400 of FIG. 4. Assuming that first printing region 502 may be used to print an image A 1001, and assuming that second printing region 504 may be used to print an image B 1002, images A and B may alternately be printed along a row onto substrate 1000. Such printing of image A 1001 may be performed while shuttering off image B 1002, followed by printing of image B 1002 performed while shuttering off image A 1001, and so on. It should be understood that in a lithographic scanner, a scanner may have continuous or approximately continuous movement in a first direction for imaging while a mask is continuously or approximately continuously moved in a second direction opposite to such first direction. Along those lines, a row of images A, B, A, B, . . . may be printed onto a resist layer on a substrate 1000.

FIG. 11-1 is a block diagram depicting an exemplary embodiment of a portion of substrate 1000 having images A printed thereon using a first mask 810 of mask set 800 of FIG. 8. In another embodiment, a first mask 910 of mask set 900 of FIG. 9 may be used. In this exemplary embodiment, images A 1001 are printed in a row on a resist layer on substrate 1000 with spaces 1101 between printings of such images A 1001. Along those lines, all images A 1001 may be printed on a wafer prior to printing any of images B 1002. However, in another embodiment, all images A 1001 may be printed in a row onto a resist layer on substrate 1000, and after completion of such row, first mask 810 may be removed from a lithographic scanner and replaced with a second mask 811 of mask set 800 of FIG. 8.

FIG. 11-2 is the block diagram of the exemplary embodiment of FIG. 11-1 having images B printed thereon using second mask 811 of mask set 800 of FIG. 8. In this exemplary embodiment, images B 1002 are printed in spaces 1101 between images A 1001 in a row on a resist layer on substrate 1000. The resist layer used for printing images A 1001 and images B 1002 may be the same resist layer, as swapping out masks in a lithographic scanner does not involve having to exchange one wafer for another in such lithographic scanner. Along those lines, all images B 1002 may be printed on a wafer prior to removal of such wafer. However, in another embodiment, all images B 1001 may be printed in a row onto a resist layer on substrate 1000, and after completion of such row, second mask 811 may be removed from a lithographic scanner and replaced with a first mask 810 of mask set 800 of FIG. 8.

FIG. 12-1 is a block diagram depicting an exemplary embodiment of a portion of an interposer 1000 having conductive lines 507 and 508 formed using multistep imaging with overlapping imaging fields. Conductive lines 507 have a length 1204, and conductive lines 508 have a length 1205. An imaging field associated with printing for creation of conductive lines 507 has a rightmost edge 1212, and an imaging field associated with printing for creation of conductive lines 508 has a leftmost edge 1211. Accordingly, such imaging fields overlap one another.

Nearest neighbor spacing between conductive lines 507, as well as nearest neighbor spacing between conductive lines 508, is distance 1202. However, in an overlap region 1203, where a first printing region and a second printing region are printed overlapping one another, intersections of conductive lines 507 and 508 may have bulges 1210. Nearest neighbor spacing is narrower, namely distance 1201, between conductive lines created from conductive lines 507 and 508 for interconnecting a first circuit portion and a second circuit portion.

FIG. 12-2 is a block diagram depicting an exemplary embodiment of a portion of an interposer 1000 having conductive lines 507 and 508 formed using multistep imaging with abutting imaging fields. Conductive lines 507 have a length 1204, and conductive lines 508 have a length 1205. Nearest neighbor spacing between conductive lines 507, as well as nearest neighbor spacing between conductive lines 508, is distance 1202. An imaging field associated with printing for creation of conductive lines 507 has a rightmost edge 1213, and an imaging field associated with printing for creation of conductive lines 508 has a leftmost edge 1213. Accordingly, such imaging fields abut one another. By abutting image fields, nearest neighbor spacing for conductive lines 507 and 508 may be the same distance, namely, distance 1202, at intersections of conductive lines 507 and 508. In other words, nearest neighbor spacing between conductive lines created from conductive lines 507 and 508 for interconnecting a first circuit portion and a second circuit portion may be distance 1202.

FIG. 12-3 is a block diagram depicting an exemplary embodiment of a portion of an interposer 1000 having conductive lines 507 and 508 formed using multistep imaging with spaced-apart imaging fields. Conductive lines 507 have a length 1204, and conductive lines 508 have a length 1205. Nearest neighbor spacing between conductive lines 507, as well as nearest neighbor spacing between conductive lines 508, is distance 1202. An imaging field associated with printing for creation of conductive lines 507 has a rightmost edge 1212, and an imaging field associated with printing for creation of conductive lines 508 has a leftmost edge 1211. Accordingly, such imaging fields are spaced-apart from one another.

Nearest neighbor spacing between conductive lines 507, as well as nearest neighbor spacing between conductive lines 508, is distance 1202. However, in an spaced apart region 1220, where a first printing region and a second printing region are printed spaced apart from one another, intersections of conductive lines 507 and 508 may be pinched, namely have indentations 1223. Nearest neighbor spacing may be wider in spaced apart region 1220; however, width of conductive lines created from conductive lines 507 and 508 for interconnecting a first circuit portion and a second circuit portion may be narrower, namely pinched width 1221 where a conductive line is located in such spaced apart region 1220.

Figure 13:
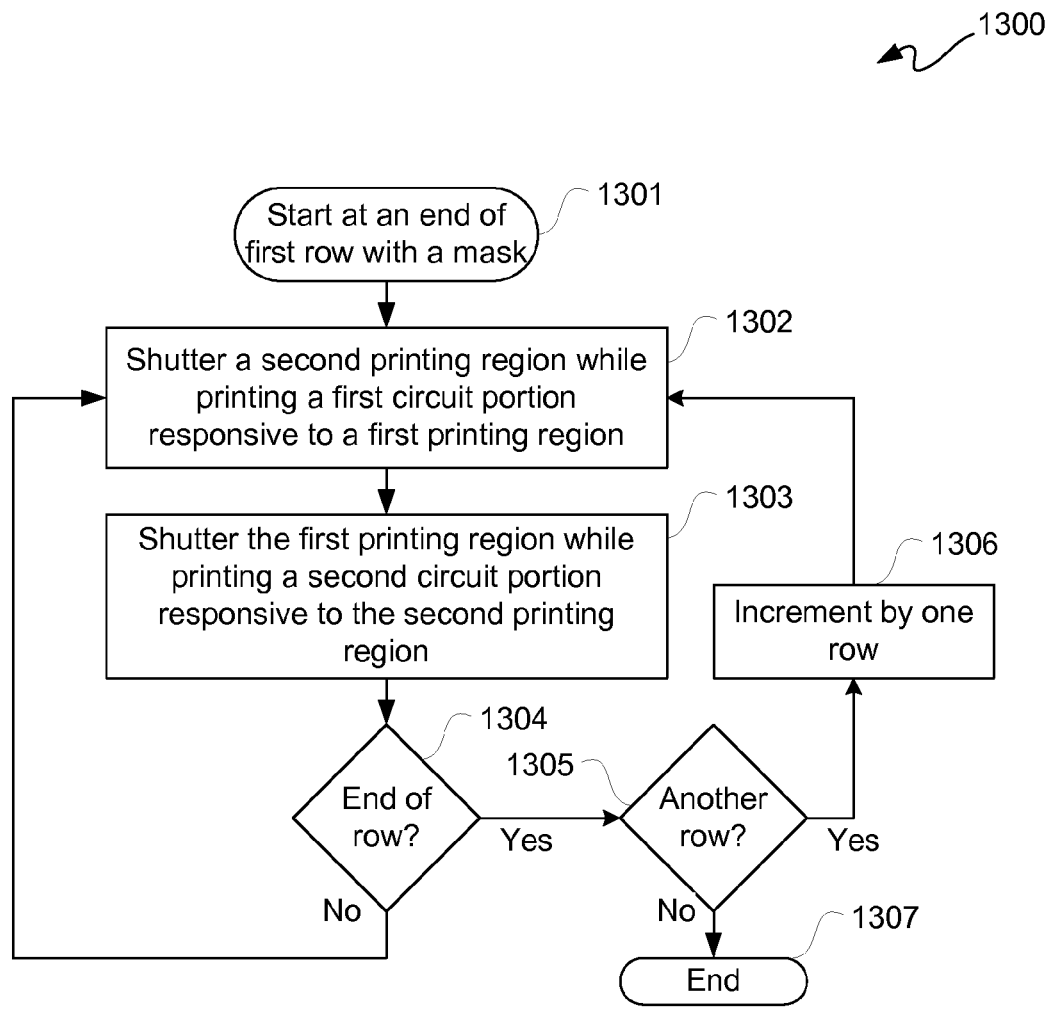
FIG. 13 is a flow diagram depicting an exemplary embodiment of a lithographic imaging flow using the dual printing region mask of FIG. 4.

FIG. 13 is a flow diagram depicting an exemplary embodiment of a lithographic imaging flow 1300 using dual printing region mask 400 of FIG. 4. At 1301, after dual printing region mask 400 and an interposer wafer has been loaded into a lithographic scanner, imaging may begin at an end of a first row to be imaged onto such interposer wafer.

At 1302, a second printing region 504 is shuttered while a first circuit portion is printed in such row responsive to a first printing region 502 of dual printing region mask 400. After printing such first circuit portion, at 1303 such first printing region 502 is shuttered while a second circuit portion is printed in such row responsive to second printing region 504 of dual printing region mask 400. Printing at 1303 may be for having a rightmost edge of the image printed at 1302 proximate to a leftmost edge of the image printed at 1303, as previously described. Along those lines, proximate may include overlapping, abutting, and/or spacing apart.

At 1304, it is determined whether a far end of a row has been reached. If the end of a row has not been reached, then at 1302 another printing of such first circuit portion in such row is performed as previously described. Along those lines, images may alternately be printed in a row.

If, however, at 1304 it is determined that a far end of the row has been reached, then at 1305, it is determined whether another row is to be printed on such wafer with such alternating first circuit portion and second circuit portion images. If another row is to be printed on such wafer as determined at 1305, then at 1306 a row count is incremented by one and printing at 1302 is repeated as previously described. It should be understood because of continuous movement of a lithographic scanner as previously described, such imaging is continuous without having to have steps for moving a lithographic scanner from place to place as in a step and scan.

If, however, at 1305 it is determined that no other row be printed on an interposer wafer, then at 1307 lithographic imaging flow 1300 ends. Even though the above described embodiment was described with respect to rows, it should be understood that columns may alternatively be used. Furthermore, even though the above description was in terms of a lithographic scanner, it should be understood that other types of lithographic equipment may be used.

Figure 14:
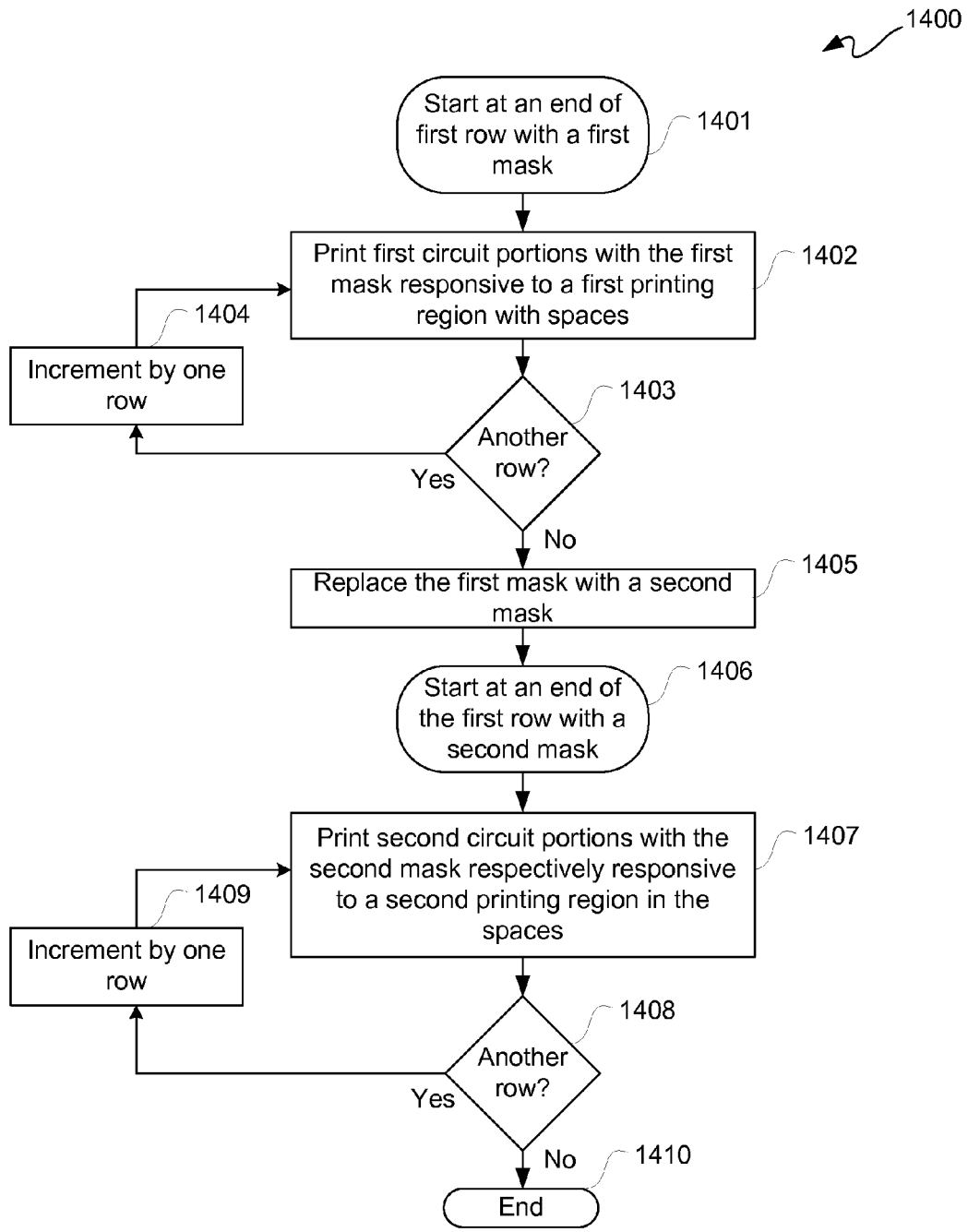
FIG. 14 is a flow diagram depicting an exemplary embodiment of a lithographic imaging flow using the mask set of FIG. 8.

FIG. 14 is a flow diagram depicting an exemplary embodiment of a lithographic imaging flow 1400 using mask set 800 of FIG. 8. At 1401, after first mask 810 and an interposer wafer have been loaded into a lithographic scanner, imaging may begin at an end of a first row to be imaged onto such interposer wafer.

At 1402, first circuit portions are respectively printed with first mask 810 for a first row responsive to a first printing region 502 of such first mask 810. Such first circuit portions are printed spaced apart in such row leaving room for printing second circuit portions in such first row with a second printing region 504 of a second mask 811, as previously described.

At 1403, it is determined whether another row is to be printed. It should be understood that all first circuit portions for an interposer wafer may be printed before printing any second circuit portions onto a resist layer of such interposer wafer. If, at 1403, it is determined that another row of first circuit portions is to be printed, then at 1404 a row count may be incremented by one, and another row of first circuit portions may be printed at 1402.

If, however, at 1403 it is determined that another row of first circuit portions as not to be printed for such interposer wafer, then at 1405 first mask 810 may be removed from a lithographic scanner and replaced with a second mask 811.

With such interposer wafer left in the lithographic scanner, at 1406 such lithographic scanner may be positioned for starting imaging at an end of such first row using such second mask 811.

At 1407, second circuit portions are respectively printed with first mask 811 for such first row responsive to a second printing region 504 of such second mask 811. Such second circuit portions are printed in spaces between spaced apart first circuit portions.

At 1408, it is determined whether another row of second circuit portions is to be printed. It should be understood that all second circuit portions for an interposer wafer may be printed onto a resist layer of such interposer wafer before removing such interposer wafer from such lithographic scanner. If, at 1408, it is determined that another row of second circuit portions is to be printed, then at 1409 a row count may be incremented by one, and another row of second circuit portions may be printed at 1407.

If, however, at 1408 it is determined that another row of second circuit portions is not to be printed, then at 1410 lithographic imaging flow 1400 may end.

Figure 15:
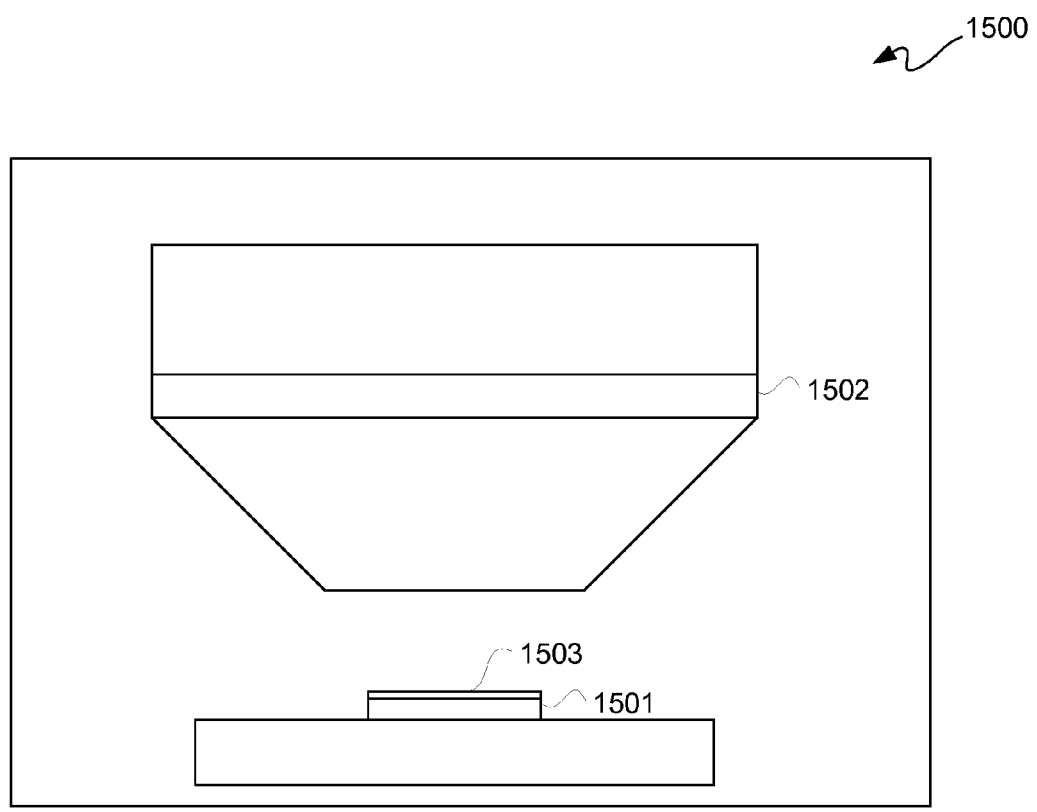
FIG. 15 is a block diagram depicting an exemplary embodiment of a conventional lithographic scanner.

FIG. 15 is a block diagram depicting an exemplary embodiment of a conventional lithographic scanner 1500. Loaded into lithographic scanner 1500 are wafer 1501 and mask 1502. Wafer 1501 may have a resist layer 1503.

While the foregoing describes exemplary embodiments, other and further embodiments in accordance with the one or more aspects may be devised without departing from the scope thereof, which is determined by the claims that follow and equivalents thereof. Claims listing steps do not imply any order of the steps. Trademarks are the property of their respective owners.

What is claimed is:
1. An interposer, comprising:
a first circuit portion created responsive to a first printing region; and
a second circuit portion created responsive to a second printing region;
wherein the interposer has at least one of: (a) a length dimension greater than a maximum reticle length dimension, and (b) a width dimension greater than a maximum reticle width dimension; and
wherein first conductive lines of the first circuit portion interconnect with second conductive lines of the second circuit portion with bulging at intersections thereof responsive to the first printing region and the second printing region printed overlapping or abutting one another.

2. The interposer according to claim 1, wherein the first printing region and the second printing region are of a same mask.

3. The interposer according to claim 2, wherein the mask includes:
a first light blocking region disposed between the first printing region and the second printing region; and
a second light blocking region disposed around the first printing region, the second printing region, and the first light blocking region.

4. The interposer according to claim 1, wherein the first circuit portion and the second circuit portion do not include a die seal between the first circuit portion and the second circuit portion.

5. The interposer according to claim 1, wherein the first printing region and the second printing region are for a first slice and a second slice, respectively, of the interposer.

6. The interposer according to claim 1, wherein:
the first printing region and the second printing region are for imaging with at least one sufficiently large dimension so as to avoid optical proximity correction for printing the first circuit portion proximate to the second circuit portion; and
the interposer has the length dimension greater than 33 mm or the width dimension greater than 26 mm.

7. The interposer according to claim 1, wherein the first printing region and the second printing region are of a same mask set including a first mask and a second mask, respectively for the first printing region and the second printing region.

8. A method for fabricating an interposer, comprising:
printing a first circuit portion of the interposer responsive to a first printing region; and
printing a second circuit portion of the interposer responsive to a second printing region proximate to the first circuit portion for interconnection therewith;
wherein the interposer has at least one of: (a) a length dimension greater than a maximum reticle length dimension, and (b) a width dimension greater than a maximum reticle width dimension; and
wherein first conductive lines of the first circuit portion interconnect with second conductive lines of the second circuit portion with bulging at intersections thereof responsive to the first printing region and the second printing region printed overlapping or abutting one another.

9. The method according to claim 8, wherein the first circuit portion and the second circuit portion does not include a die seal between the first circuit portion and the second circuit portion.

10. The method according to claim 8, further comprising:
obtaining a mask set having a first mask and a second mask;
wherein the first printing region is of the first mask;
wherein the second printing region is of the second mask;
wherein the printing of the first circuit portion responsive to the first printing region includes printing each of a plurality of first circuit portions in at least one row with spaces between the first circuit portions;
replacing the first mask with the second mask;
wherein the printing of the second circuit portion responsive to the second printing region includes printing each of a plurality of second circuit portions in the at least one row with the second printing region printed in the spaces; and
wherein the interposer has the length dimension greater than 33 mm or the width dimension greater than 26 mm.

11. A mask set, comprising:
a first mask and a second mask;
wherein the first mask has a first printing region;
wherein the second mask has a second printing region;
wherein the first printing region is to print a first circuit portion of an interposer;
wherein the second printing region is to print a second circuit portion of the interposer proximate to the first circuit portion for interconnection between the first circuit portion and the second circuit portion;
wherein the interposer has at least one of: (a) a length dimension greater than a maximum reticle length dimension, and (b) a width dimension greater than a maximum reticle width dimension; and
wherein the first printing and the second printing region are laid out so as not to include a die seal between the first circuit portion and the second circuit portion.

12. The mask set according to claim 11, wherein:
the first printing region is laid out to repetitively print the first circuit portion to provide a row of first circuit portions on a wafer with spaces between the first circuit portions; and
the second printing region is laid out to repetitively print the second circuit portion to provide the row with second circuit portions iteratively in the spaces between the first circuit portions.

13. The mask set according to claim 11, wherein:
the first printing region and the second printing region are to image with at least one sufficiently large dimension so as to avoid optical proximity correction to print the first circuit portion proximate to the second circuit portion; and
the interposer has the length dimension greater than 33 mm or the width dimension greater than 26 mm.

14. An interposer, comprising:
a first circuit portion created responsive to a first printing region; and
a second circuit portion created responsive to a second printing region;
wherein the interposer has at least one of: (a) a length dimension greater than a maximum reticle length dimension, and (b) a width dimension greater than a maximum reticle width dimension; and
wherein the first circuit portion and the second circuit portion do not include a die seal between the first circuit portion and the second circuit portion.

* * * * *